(12) United States Patent
Lyons et al.

(10) Patent No.: US 6,654,659 B1
(45) Date of Patent: Nov. 25, 2003

(54) QUARTZ CRYSTAL MONITOR WAFER FOR LITHOGRAPHY AND ETCH PROCESS MONITORING

(75) Inventors: Christopher F. Lyons, Fremont, CA (US); Cyrus E. Tabery, Cupertino, CA (US)

(73) Assignee: Advanced Micro Drvices, Inc., Sunnyvale, CA (US)

( * ) Notice: Subject to any disclaimer, the term of this patent is extended or adjusted under 35 U.S.C. 154(b) by 15 days.

(21) Appl. No.: 10/178,084

(22) Filed: Jun. 24, 2002

(51) Int. Cl.[7] ........................... G06F 19/00; H01L 21/00
(52) U.S. Cl. .................... 700/121; 700/95; 438/5; 257/E21.001
(58) Field of Search .................... 700/90, 95, 117, 700/121; 438/5, 8, 7; 708/190; 257/E21.001

(56) References Cited

U.S. PATENT DOCUMENTS

| | | | | |
|---|---|---|---|---|
| 4,927,785 A | * | 5/1990 | Theeten et al. ................ 438/9 |
| 6,129,807 A | * | 10/2000 | Grimbergen et al. .. 156/345.24 |
| 6,174,407 B1 | * | 1/2001 | Johnson et al. ........ 156/345.25 |
| 6,295,861 B1 | * | 10/2001 | Tom et al. ................ 73/24.06 |
| 6,562,248 B1 | * | 5/2003 | Subramanian et al. ........ 216/12 |

* cited by examiner

*Primary Examiner*—Jayprakash N. Gandhi
(74) *Attorney, Agent, or Firm*—Amin & Turocy, LLP

(57) ABSTRACT

One aspect of the present invention relates to a feedback-driven, closed loop system/method for obtaining consistently formed semiconductor structures. The system/method involves controlling the progression of a lithography process such as a deposition or etching process. The system employs one or more piezoelectric sensors, such as quartz crystal sensors, integrated on a wafer. During the lithography process, the sensors produce frequency data which is analyzed and communicated to a lithography process controller in order to modulate one or more process parameters and/or one or more process components. The frequency data indicates the progression of the lithography process and facilitates determining whether the parameters/components need correction to obtain structures which are consistent throughout the wafer and from wafer to wafer. Data generated by each sensor located at an area on the wafer may be cross-referenced with data from other sensors on the wafer and with data from other wafers to ensure uniformity and consistency among the wafers.

31 Claims, 11 Drawing Sheets

US 6,654,659 B1

QUARTZ CRYSTAL MONITOR WAFER FOR LITHOGRAPHY AND ETCH PROCESS MONITORING

TECHNICAL FIELD

The present invention generally relates to processing a semiconductor substrate. In particular, the present invention relates to a system and method of forming layers and structures on a wafer integrated with sensors to monitor wafer changes and thus optimize uniform layer and structure formation.

BACKGROUND ART

Many modem integrated circuits generally include multiple layers of metallic or conductive wiring surrounded and covered by insulating or dielectric layers. Maintaining the utmost accuracy in the deposition of these layers and subsequent formation of conductive and nonconductive features is critical in achieving smaller and smaller device dimensions and higher packing densities using conventional lithographic processes.

In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photoresist mask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photoresist mask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Deposition of the photoresist mask, as well as deposition of any other layer critical to the performance of the semiconductor device, requires several parameters to be set and/or calibrated before a particular deposition or etch process may begin. However, due to wafer-to-wafer variations, the large number of factors (parameters) involved in a lithographic process, and the variability of process conditions which may arise in the chamber, pre-set process parameters may not produce consistent layers and structures.

Conventional methods typically employed to remedy these inconsistencies among wafers have proven to be both problematic and costly. Such methods usually require stopping the process to examine the wafer and then resuming the process if further processing is necessary. In some cases, the wafer may be damaged and require repair. If the damage is beyond repair, then the wafer must be discarded. In the former situation, it is difficult to obtain consistent wafers since the process and its parameters are continuously stopped and then resumed at a later time. In both situations, production costs increase, production efficiency decreases and actual product is less than effective or less than projected based on the number of wafers put into production.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides a system and method for obtaining consistently formed semiconductor devices. More specifically, the present invention provides a system and method for controlling the progression of a lithographic process such as a deposition or etch process. This is accomplished in part by employing one or more piezoelectric sensors, such as quartz crystal sensors, integrated into a wafer. The sensors capture and/or indicate changes in the wafer. The data received from the sensors may relate to deposition and/or etch rates, density and/or thickness, and uniformity of the subject wafer. This information may be continuously fed back into the lithographic process in order to determine the endpoint for the process. When more than one sensor is employed in this manner, data from each sensor may be cross-referenced which facilitates determining uniformity of the layer (e.g., uniform vias, trenches, layer, gates, and the like).

One aspect of the present invention relates to a feedback-driven, closed-loop system for controlling the progression of a lithography process. The system contains a wafer comprising one or more piezoelectric sensors, a voltage source and a transmitter integrated within the wafer, wherein each piezoelectric sensor is operable to generate data relating to the lithography process; an analyzer operably connected to the wafer for receiving data communicated from the transmitter; and a lithography process controller for regulating one more process parameters and one or more process components based on the data in order to facilitate consistently formed semiconductor devices.

Another aspect of the present invention relates to a feedback-driven, closed loop method for controlling the progression of a lithography process. The method includes providing a wafer comprising one or more quartz crystal sensors, a voltage source and a transmitter integrated within the wafer, wherein each quartz crystal sensor is operable to generate data relating to the lithography process; subjecting the wafer to the lithography process; and during the lithography process, measuring a frequency of the one or more quartz crystal sensor, communicating the measured frequency to an analyzer, relaying information related to the measured frequency back to a lithography process controller, and modulating a lithography process controller in-situ according to the measured frequency in order to obtain consistently formed semiconductor devices.

Yet another aspect of the present invention relates to a feedback-driven, closed loop method for controlling the progression of a lithography process. The method includes providing a wafer comprising at least two quartz crystal sensors, a voltage source and a transmitter integrated within the wafer, wherein each quartz crystal sensor is operable to generate data relating to the lithography process; applying a fixed voltage to the at least two quartz crystal sensors; subjecting the wafer to the lithography process; during the lithography process, obtaining separate data from each of the at least two quartz crystal sensors, communicating the separate data to an analyzer, feeding information corresponding to the separate data back to a lithography process controller, and modulating one or more process parameters and one or more process components in-situ according to the data in order to obtain consistently formed semiconductor devices; and cross-referencing the separate data in order to determine whether uniformity exists in at least two locations on the wafer.

Still another aspect of the present invention relates to a feedback-driven, closed loop system for obtaining consistently formed semiconductor devices. The system includes a plurality of wafers, each wafer containing one or more quartz crystal sensors, a voltage source and a transmitter integrated within the wafer, wherein each quartz crystal sensor is operable to generate data relating to the lithography process; an analyzer operably connected to each wafer for receiving data communicated from the transmitter; a processor for cross-referencing the data obtained from the plurality of wafers to determine structure uniformity among the plurality of wafers; and a lithography process controller for regulating one more process parameters and one or more process components based on the data in order to facilitate consistently formed semiconductor devices.

DISCLOSURE OF INVENTION

Figure 1:
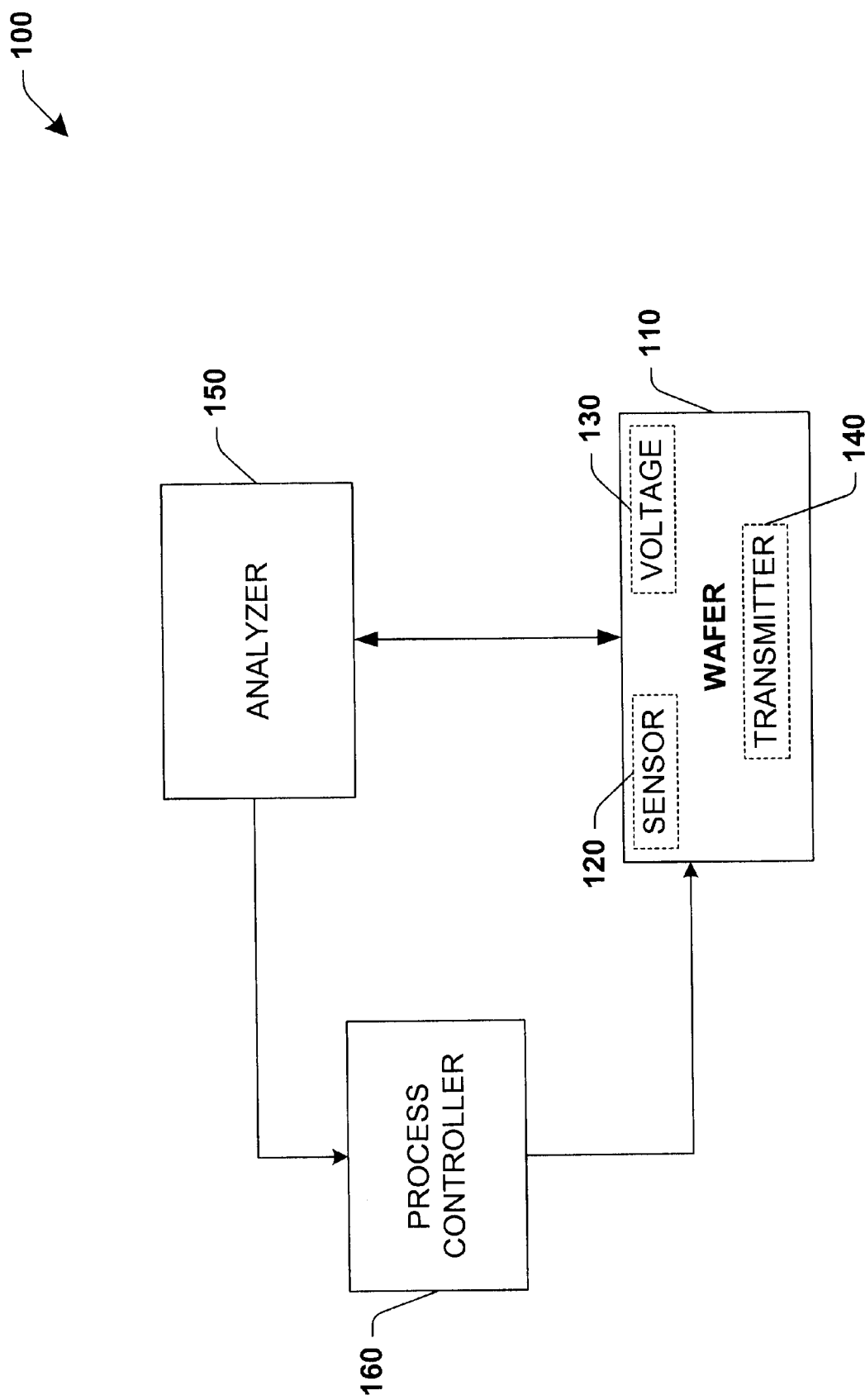
FIG. 1 illustrates a high-level, schematic block diagram of a feedback-driven, closed loop system in accordance with an aspect of the present invention.

The present invention involves a system and method for obtaining consistently formed semiconductor structures and devices. One aspect of the present invention more specifically relates to a feedback-driven, closed loop system and method employing one or more sensors, such as a piezoelectric sensor, a voltage source and a transmitter, all of which are integrated on or into a wafer. During a lithography process, such as a deposition and/or etch process, a fixed voltage is applied to the piezoelectric sensors in order to activate them. The applied voltage elicits a vibration from the sensor. The frequency of the vibrations fluctuates or modulates proportionally according to a mass of material either deposited or removed from above it. For instance, the frequency of vibrations decreases in proportion to an increase in the mass of material deposited over the sensor. Therefore, when the sensors are integrated on or into a wafer during a lithography process, information regarding the status and progression of the particular process can be ascertained and even fed back into the process controller in order to optimize the lithography process.

The sensors monitor changes in the wafer as a result of processing. For example, the deposition of materials and/or the etching of materials cause changes in the wafer that may be detected by piezoelectric sensors that utilize piezoelectric effects. In other words, piezoelectric sensors capture and/or indicate changes in the wafer. Quartz crystal sensors are one non-limiting example of a piezoelectric sensor, as other suitable sensors may be employed.

In particular, the frequency data may be collected and communicated via a transmitter to a frequency analyzer. The frequency analyzer breaks down the frequency data into information regarding, for example, deposition and/or etch rate of the current process and the amount of material either deposited or removed from the "sensored" area. The analyzer communicates this information in a usable form to a lithography process controller, which oversees one or more process parameters and one or more process components. Examples of process parameters include deposition or etch rate, temperature, pressure, pH, solvents and plasma type. The process components include the physical elements used to carryout the parameter settings.

According to the information received from the analyzer, the controller can modulate the parameters and/or components in order to obtain uniform semiconductor structures on the current wafer as well as structures which are consistently and uniformly formed among a large number of wafers produced in a batch.

In addition, when more than one sensor is employed, data from each sensor may be collected and stored separately. This permits a user or micro-processing unit to cross-reference the data between two or more sensors, which facilitates determining whether a layer or structure has been formed uniformly. For example, when forming a metal layer over a dielectric layer, the user may desire the metal layer to be uniformly thick across the dielectric layer. Lack of uniformity in this and other critical layers may cause distortion in the function of the completed device. Thus, placement of two or more sensors at more than one location on the wafer allows for their frequency data to be cross-referenced with respect to one another. This principle is also applicable during an etch process, where it may be desirable to form uniform vias, trenches, and/or gates at different locations on the wafer and/or at different locations across a layer on the wafer.

A more detailed description of the present invention may be found below with respect to FIGS. 1–12.

FIG. 1 illustrates a high-level, schematic block diagram of a feedback-driven, closed loop system 100 according to one aspect of the present invention. The system 100 includes a wafer 110 having a piezoelectric sensor, such as a quartz crystal sensor 120, a voltage source 130, and a transmitter 140 integrated on and/or in the wafer, a frequency analyzer 150 coupled to the wafer, and a lithography process controller 160 coupled to the analyzer 150 and operable over the process employed to fabricate a semiconductor device one the wafer 110. The voltage source 130 provides the power to the quartz crystal sensor 120. When a fixed voltage 130 is applied to the sensor 120, the sensor vibrates at a frequency proportional to an amount of material deposited (present) or removed from above it. For example, during deposition of a thin film layer, including thin photoresists, the frequency of vibrations produced by the quartz crystal sensor 120 decreases in proportion to the amount of film material deposited over it.

The frequency analyzer 150 receives data from the quartz crystal sensor 120 and manipulates the data into a form more usable and understandable to the process controller 160. Once the process controller 160 receives such calculated information from the analyzer 150, the process controller 160 can determine the current progression of the lithography process and modulate one or more process parameters and one or more process components to alter the current progression. The ability to modify the current process facilitates obtaining consistently formed structures from wafer to wafer in order to accommodate for wafer-to-wafer variations and anomalies which may randomly or sporadically occur in the parameters (e.g., etch rate, temperature, deposition rate, and the like) and process components (e.g., physical elements which carry out the set parameters).

Although the wafer 110 is shown having one quartz crystal sensor 120, it should be appreciated that more than one sensor 120 may be integrated in the wafer 110. Furthermore, it should be appreciated that more than one sensor 120 may be arranged either randomly, in order or in clusters of two or more as desired by the user and the application.

Figure 2:
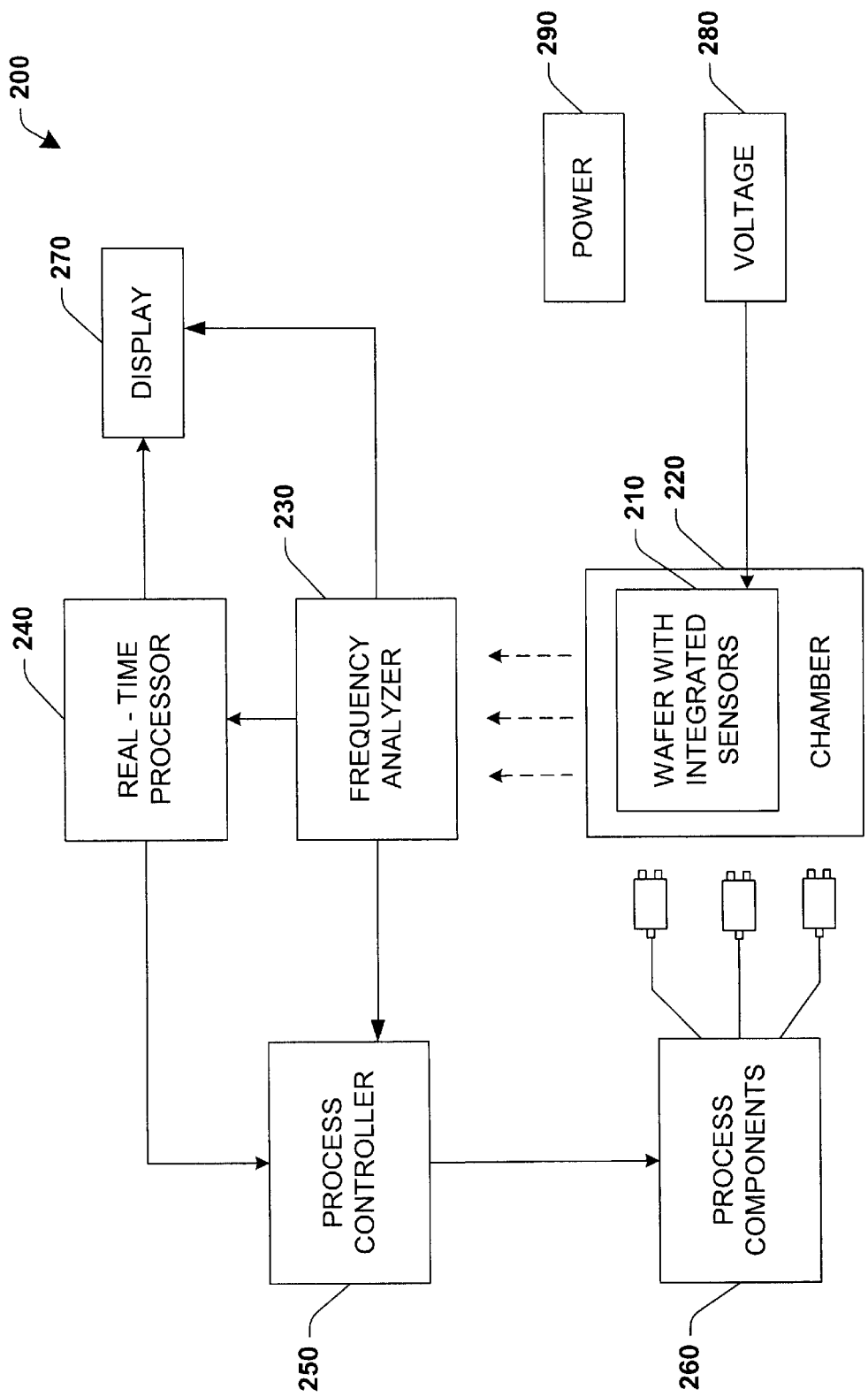
FIG. 2 illustrates a schematic block diagram of a feedback-driven, closed loop system in accordance with an aspect of the present invention.

FIG. 2 illustrates a schematic block diagram of a feedback-driven, closed loop system 200 in accordance with another aspect of the invention. The system 200 includes a wafer 210 having quartz crystal sensors integrated thereon and/or therein, whereby the wafer is placed inside of a process chamber 220. The wafer 210 also includes a transmitter (not shown) for communicating frequency data created by the sensors to a frequency analyzer 230. The frequency analyzer 230 receives and manipulates the frequency data into a form more usable and comprehendible to other functional groups (e.g., processor, controller, display) within the system 200. The analyzer 230 may transmit its processed information to a real-time processor 240 for additional processing and calculations as desired by a user, to a lithography process controller 250, and/or to an output display 270.

As previously discussed with respect to FIG. 1, the sensors may be arranged individually or in clusters comprising at least two sensors. The individual or clustered sensors may be arranged in random order or in a patterned order. When more than one sensor is employed, separate data from each sensor may be collected. The data may be analyzed separately as well which facilitates a microprocessing unit (240 or within analyzer 230) to cross-reference the data taken from more than one individual or cluster of sensors. The ability to cross-reference the frequency data allows a user and the system 200 to determine whether uniformity exists at the current layer or among different layers on a wafer and/or among similar structures formed on a number of past wafers (e.g., previously fabricated semiconductor devices). In addition, it facilitates maintaining uniformity among structures formed on subsequent wafers.

The lithography process controller 250 oversees and regulates a current or ongoing lithography process. In particular, the controller 250 operates one or more process parameters (not shown) and one or more process components 260, which function to carry out the prescribed process parameters. According to the present invention, when the lithography process controller 250 receives information related to the frequency data from either the processor 240 or the analyzer 230, the controller 250 incorporates that information into its controls to determine what, if any, modulations to the current parameter and component settings are necessary. This determination is made according to the current progression of the lithography process to achieve uniform structure formation throughout the current wafer and consistency in previously and subsequently manufactured wafers.

More specifically, the frequency data may indicate that, for example, contact holes being formed in a layer on the wafer are undesirably non-uniform in terms of width and/or depth with respect to one another. Feeding this information back to the process controller 250 facilitates an immediate correction of or adjustment to one or more process parameters and one or more process components 260. It should also be appreciated that corrections may be selectively made to the one or more parameters and components in such a way that only selected portions of a wafer are affected by the correction(s). An exemplary output display of wafers being processed in batch form may be seen in FIGS. 10 and 11, which are described in greater detail below.

The system 200 also includes a voltage source 280 which provides power to the integrated sensors on the wafer. Such voltage source may also be integrated on the wafer. In order for the sensors to function effectively, a fixed voltage is applied at levels known to those skilled in the art. Lastly, the system 200 includes a power source 290 which may be any type of battery or other power source suitable to carry out the present invention.

Figure 3:
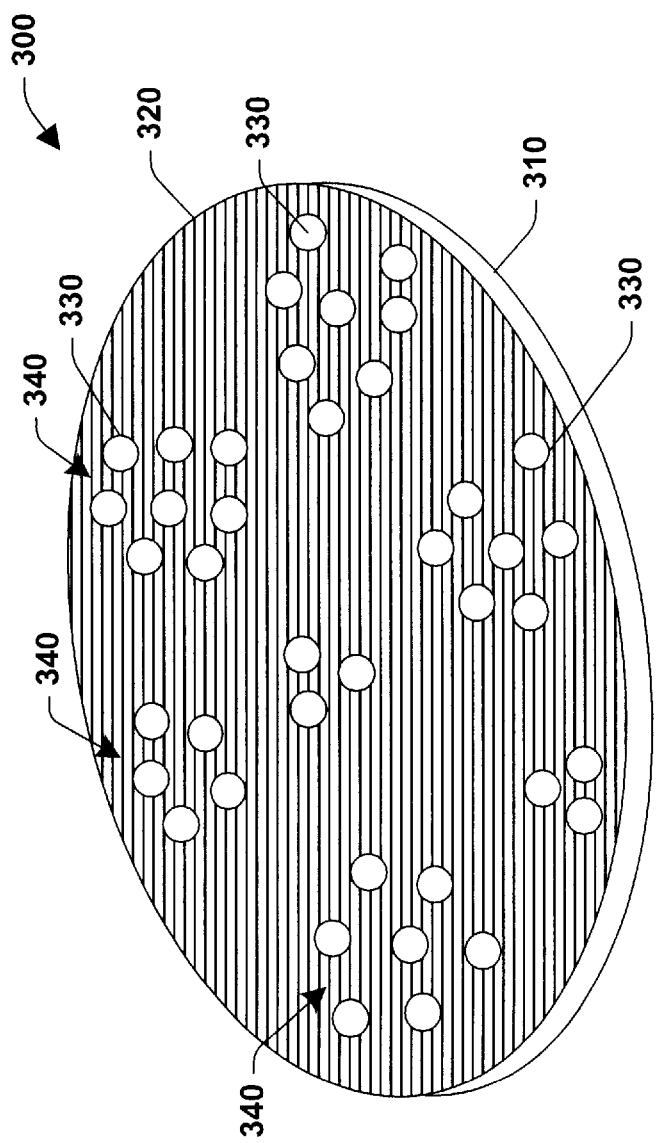
FIG. 3 illustrates a top view of a semiconductor wafer comprising quartz crystal sensors integrated on the wafer in accordance with an aspect of the present invention.

In FIG. 3, a wafer 300 having more than one quartz crystal sensor 330 is shown according to one aspect of the present invention. The wafer 300 has a layer 320 formed over a semiconductor substrate 310. As shown, the sensors 330 are formed on and/or in the layer 320. The quartz crystal sensors 330 may be arranged individually in a random or patterned order or they may be arranged in clusters 340 comprising at least two sensors 330. The individual sensors 330 and/or clusters 340 of sensors 330 may be arranged in different locations on the wafer, such as in two or more locations on a layer or on the wafer. Having sensors 330, 340 spatially arranged in various areas of the wafer or layer facilitate cross-referencing between the sensors 330 in order to determine structure uniformity. For example, some structures may be repeated within a single or multiple layers of a wafer. It may be desirable to have these structures uniform with respect to each other in order to insure proper function of the semiconductor device.

Figure 4:
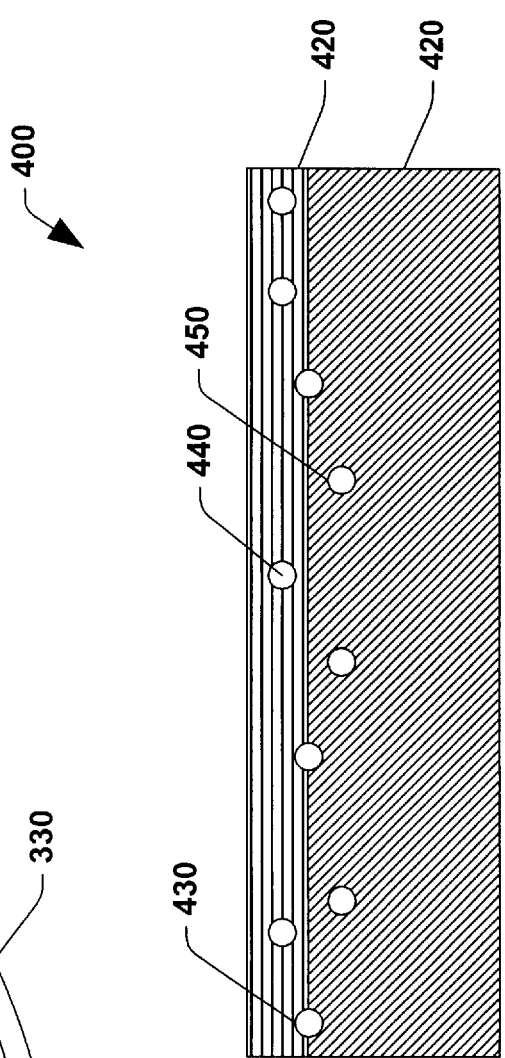
FIG. 4 illustrates a schematic, cross-sectional view of a semiconductor wafer having quartz crystal sensors integrated within the wafer in accordance with an aspect of the present invention.

FIG. 4 illustrates a schematic, cross-sectional view of a wafer 400 which is similar to wafer 300 described above. The wafer 400 includes a layer formed 420 over a substrate 410. The wafer also includes one or more quartz crystal sensors 430 which are integrated within the substrate and overlap into the layer; and sensors which are entirely within the layer 420 (sensors 440) or entirely within the substrate 410 (sensors 450). During formation of the layer 420, sensors 450 may create frequencies of vibrations depicting the amount of thin material deposited and its deposition rate. Likewise, sensors 440 may be employed during a subsequent deposition of a layer over layer 420. The precise number and placement of the sensors depends on the desired lithography application and process.

Figure 5:
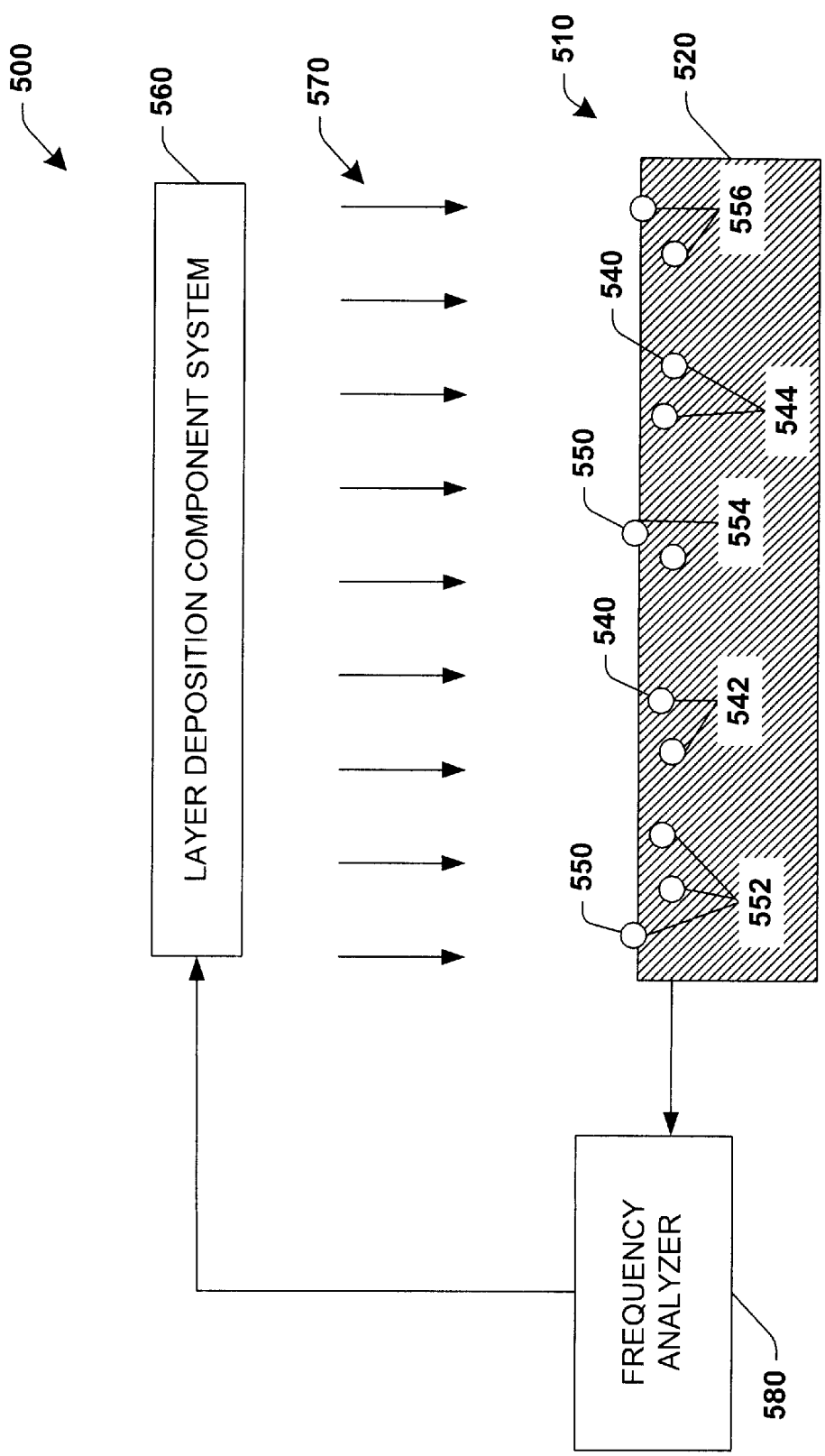
FIG. 5 illustrates a schematic cross-sectional view of a sensor-integrated wafer cooperating within a system in accordance with an aspect of the present invention.

Turning to FIG. 5, a feedback-driven, closed loop system 500 according to one aspect of the present invention is shown. The system 500 includes a wafer 510 comprising a semiconductor substrate 520 composed of a polycrystalline silicon material. One or more quartz crystal sensors 540, 550 are integrated on and/or in the substrate 520 of the wafer 510. The sensors may be integrated within the wafer 510 such as sensors 540; or may be arranged on the wafer 510 such as sensors 550. Alternatively or in addition, the sensors 540, 550 may grouped in an arrangement of one or more clusters wherein each cluster comprises of two or more sensors such as sensor clusters 542, 544, 552, 554 and 556. Each sensor and/or cluster of sensors can be characterized or labeled with a particular marker which can be used to link its frequency data to the sensor and the sensor's location on the wafer. This is particularly advantageous when cross-referencing the frequency data between sensors or clusters of sensors as described with respect to FIGS. 1 and 2 above.

Still referring to FIG. 5, the wafer 510 is undergoing a layer deposition process. A layer deposition component system 560 is employed to deposit a thin layer of material onto the wafer 510 as indicated by the arrows 570. The layer may be any material such as silicon dioxide, silicon nitride, and the like depending on the desired use and application of the wafer. During deposition, the sensors 540, 550 are activated to vibrate or oscillate via an applied fixed voltage. As the layer material is deposited, the frequency of vibrations decreases in an amount proportional to the amount of material deposited over the sensors 540, 550. Frequency data from the sensors 540, 550 may be transmitted to a frequency analyzer continuously or at fixed intervals of time.

The frequency data is further processed into usable information and this information is fed back to the layer deposition component system 560 during the deposition process. Once the information is fed back and received by the component system 560, the component system 560 "digests" the information in order to implement modifications to the current deposition process. For example, based on the frequency data, the component system may be informed that the layer is not being uniformly deposited such that the layer is thicker in some portions of the layer than in others. The component system 560 determines what corrections should be made to one or process parameters and one or more process components in order to even out the layer.

Figure 6:
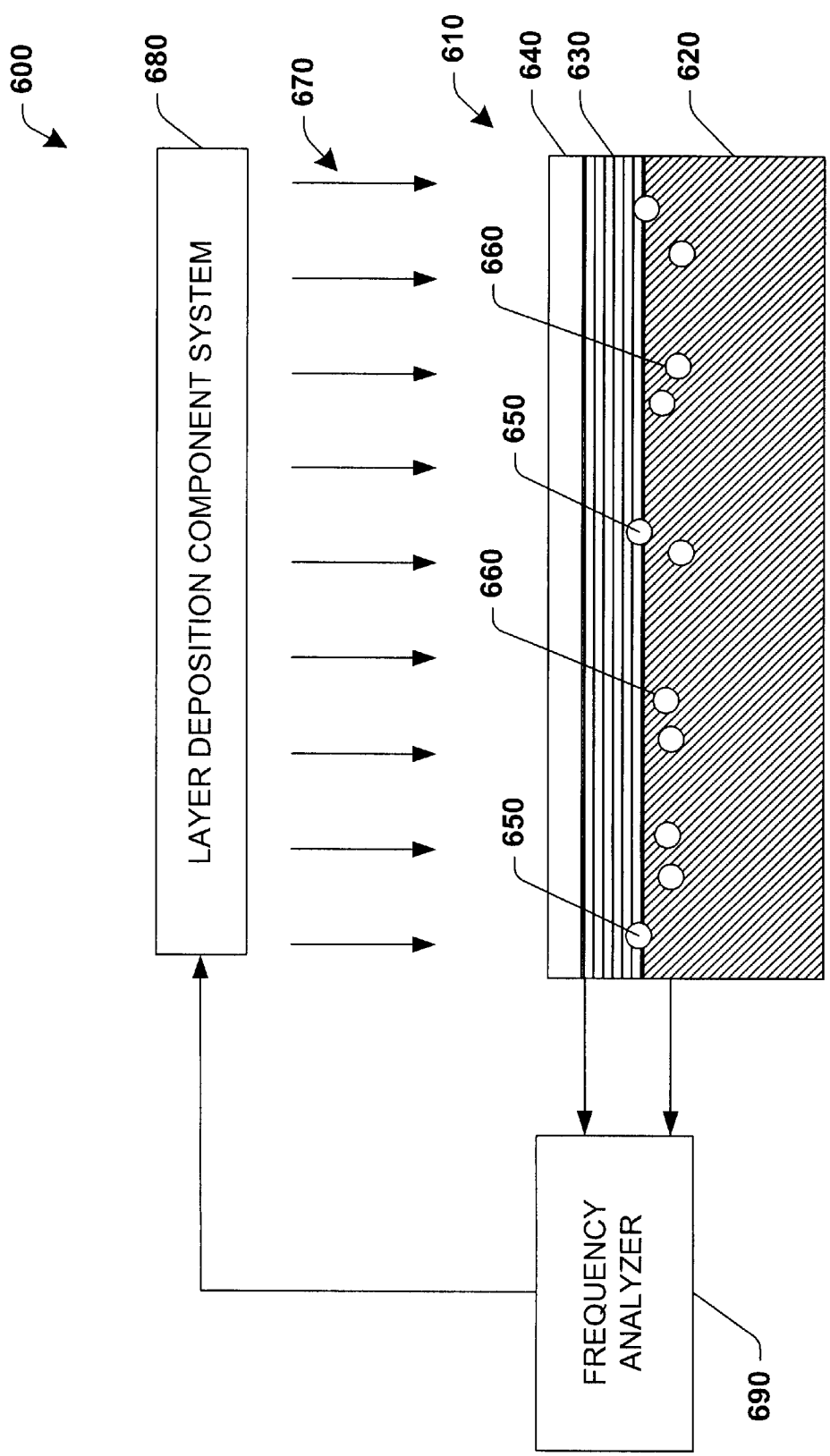
FIG. 6 illustrates a schematic cross-sectional view of a sensor-integrated wafer employed in a system and method in accordance with an aspect of the present invention.

FIG. 6 illustrates a feedback-driven, closed loop system 600 which is similar to the system 500 as described in FIG. 5. The system 600 also includes a wafer 610 having a substrate 620 and a layer 630 of material which has been substantially formed over the substrate 620. The wafer 610 also contains one or more quartz crystal sensors which are located substantially within the substrate (sensors 660) and which are located partially in the substrate 620 and partially in the layer 630 (sensors 650). A photoresist 640 has also been deposited 670 over the layer 630 by the layer deposition component system 680.

Still referring to FIG. 6, the system 600 also includes a frequency analyzer 690 similar to the analyzer described in FIGS. 1, 2 and 5 above. The layer deposition component system 680 can be signaled to terminate once the frequency data demonstrates that the layer has been uniformly and fully formed according to desired specifications and dimensions. According to one aspect of the present invention, the process may be terminated when the frequency data figures reach a pre-determined value. A trained neural network may also be incorporated into the system 600 in order to teach the system 600 how to factor in variables and compensate for insignificant fluctuations in frequency data.

Figure 7:
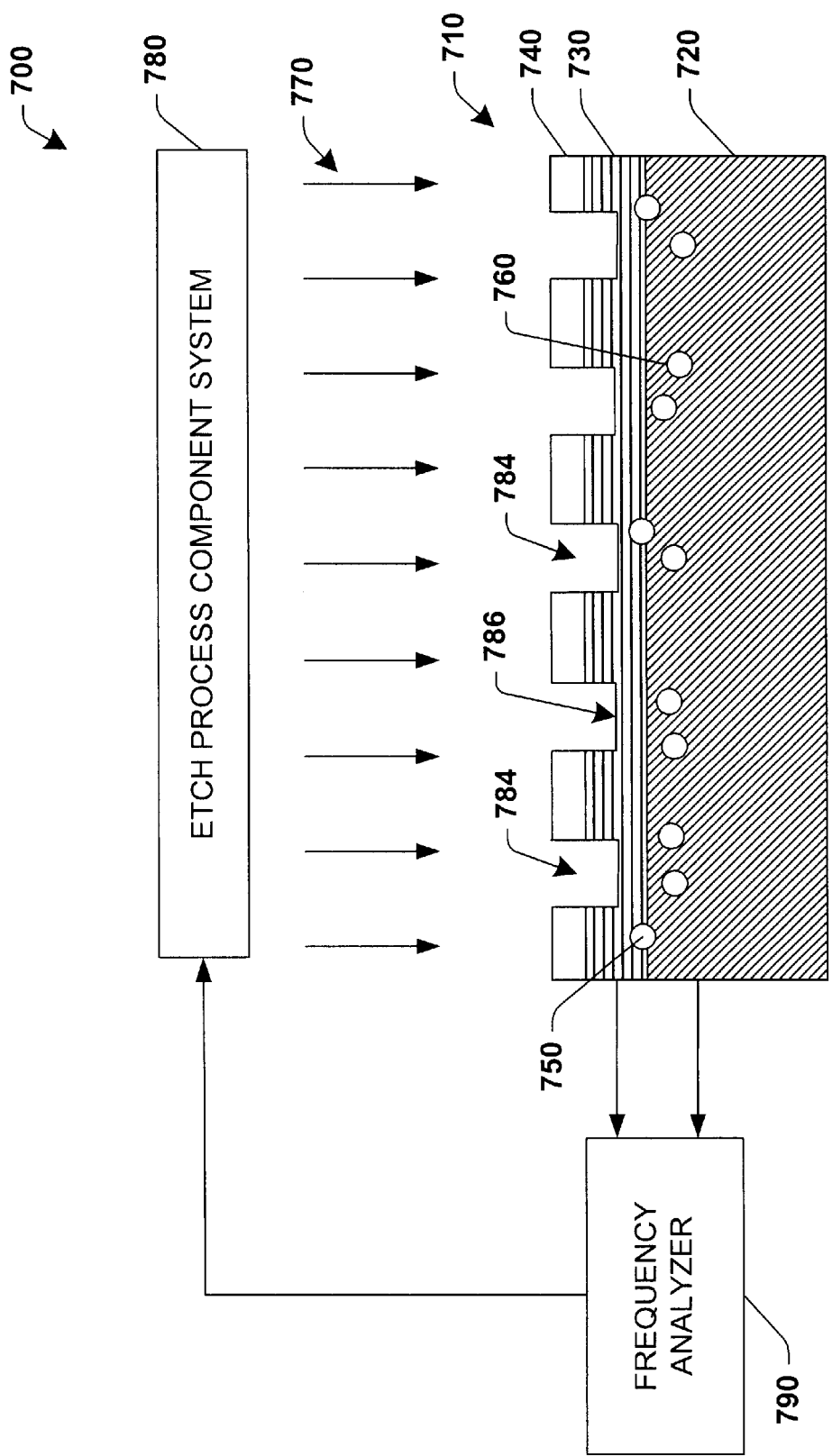
FIG. 7 illustrates a schematic cross-sectional view of a sensor-integrated wafer employed in a system and method in accordance with an aspect of the present invention.

FIG. 7 illustrates a feedback-driven, closed loop system 700 similar to the systems described in FIGS. 5 and 6, except with a few differences. The system 700 includes a wafer 710 having a substrate 720, a layer 730 formed over the substrate and a photoresist layer 740 formed over the layer 730. The wafer 710 also has sensors 750, 760 integrated within the wafer. A transmitter and a voltage source are also integrated on the wafer (not shown).

According to FIG. 7, the wafer 710 is undergoing an etch process. More specifically, the photoresist 740 is being etched 770 by an etch process component system 780 to form vias 784 in the photoresist layer 740 and then ultimately in the layer 730.

During the etching process 770, the quartz crystal sensors 750, 760 vibrate at a frequency which increases in an amount proportional to the amount of layer material 786 removed from above the sensors. The frequency data can be communicated to a frequency analyzer 790 linked to the wafer 710. The frequency analyzer 790 manipulates the data into information which is usable and comprehendible by the etch process component system 780. For example, in this case, the frequency data reflects that an amount of photoresist 740 and an amount of the layer 730 have been removed at particular locations on the wafer. It should be appreciated that frequency data arising from etched portions of the photoresist can be factored out if it is desired to only "see" data from the etched portions of the layer 730. Otherwise, data including the photoresist layer is simply accounted for when analyzing the etch process associated with the layer 730.

The frequency data may also provide etch rate information as well. In addition, the frequency data from the individual sensors may be cross-referenced in order to determine whether the etching is uniform across the layer and uniform with respect to the dimensions of vias formed in past wafers. With respect to FIG. 7, the frequency data reflects that the vias 784 are not fully formed (e.g, etching is not completed), therefore the etch process component system 780 continues as per the information received from the analyzer 790. thus, the frequency data can provide immediate guidance as to when the process has been completed and/or as to what corrections to the process components 780 are necessary to achieve the desired structure.

Figure 8:
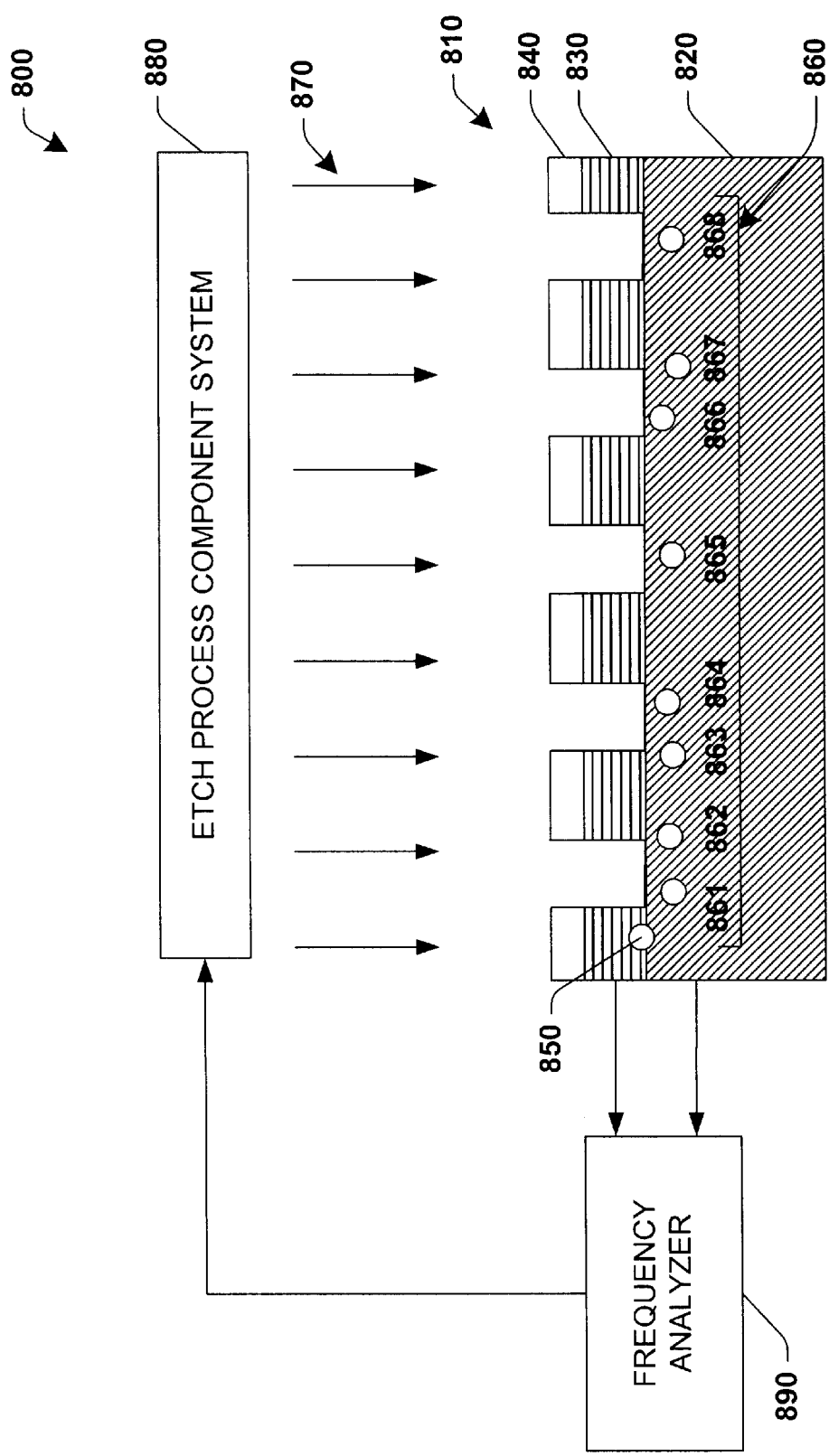
FIG. 8 illustrates a schematic cross-sectional view of a sensor-integrated wafer employed in a system in accordance with an aspect of the present invention.

FIG. 8 illustrates a cross-sectional view of a feedback-driven, closed loop system 800 which is also similar to the systems described in FIGS. 1, 2, and 5–7. The system 800 includes a wafer 810 which comprises a semiconductor substrate 820, a layer 830 formed over the substrate 820 and a photoresist 840 over the layer 830. The wafer 810 also includes one or more quartz crystal sensors 850, 860 (861, 862, 863, 864, 865, 866, 867, 868 collectively referred to as "860") spatially arranged within the wafer to optimize controlling the progression of the on-going etch process.

As can be seen, the wafer 810 is being etched 870 by an etch process component system 880. During the etching process, the sensors 850, 860 provide frequency data to a frequency analyzer 890 coupled thereto. The frequency data associated with the sensors 850, 860 is processed and communicated for input into the etch process component system 880. The etch process component system 880 uses this information to determine whether to continue etching, whether to make any adjustments to the one or more process parameters and the one or more process components, or whether to terminate the etching.

Because the layer 830 has been substantially etched according to the desired pattern, the frequency data reflects that the etching has been substantially completed which signals the etch process component system 880 to terminate. In one aspect of the present invention, the lithography process can be signaled to terminate when the frequency value reaches a predetermined value. This pre-determined value may be derived from calculating and/or manipulating a number of variables which are sensitive to the quartz crystal sensor and which affect the frequency of its vibrations.

Figure 9:
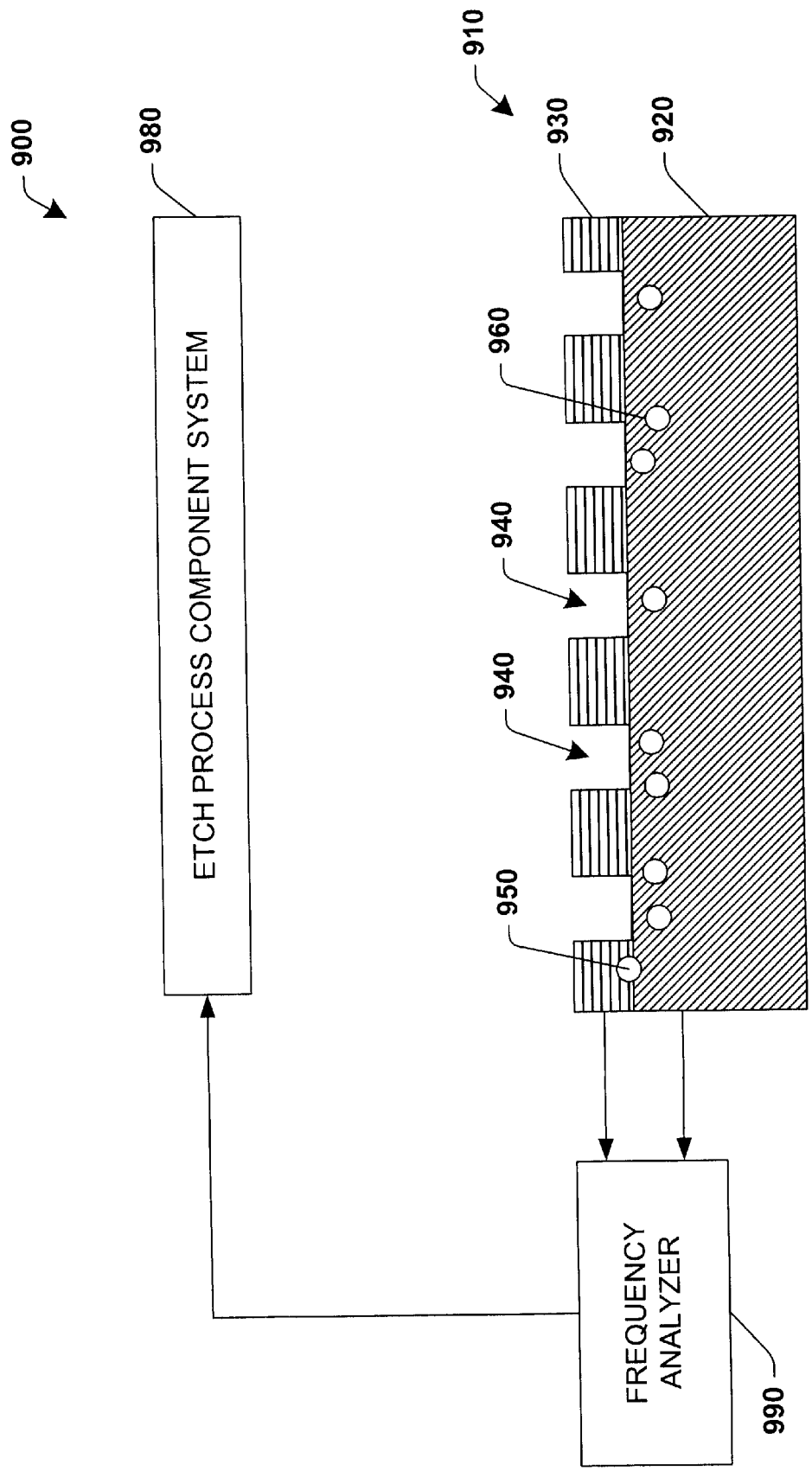
FIG. 9 illustrates the wafer as shown in FIG. 10 following substantial completion of a method in accordance with the present invention.

FIG. 9 shows a wafer 910 substantially etched in a feedback-driven, closed loop system 900 similar to that of FIG. 8. The wafer 910 includes a substrate 920 and a layer 930 having via structures 940 substantially etched therein. An etch process component system 980 has terminated the etch process based on information received from a frequency analyzer 990. The information relates to frequency data provided by one or more sensors 950, 960 which are integrated into the wafer 910. Once the sensors 950, 960 indicate that the structures are accurately and uniformly formed (e.g., frequencies have reached a pre-determined value), the etch process component system 980 terminates the process. This permits an automated system or user to control the progression of a lithography process using a means which is neither destructive nor inhibitory to the formation and operation of semiconductor devices.

Figure 10:
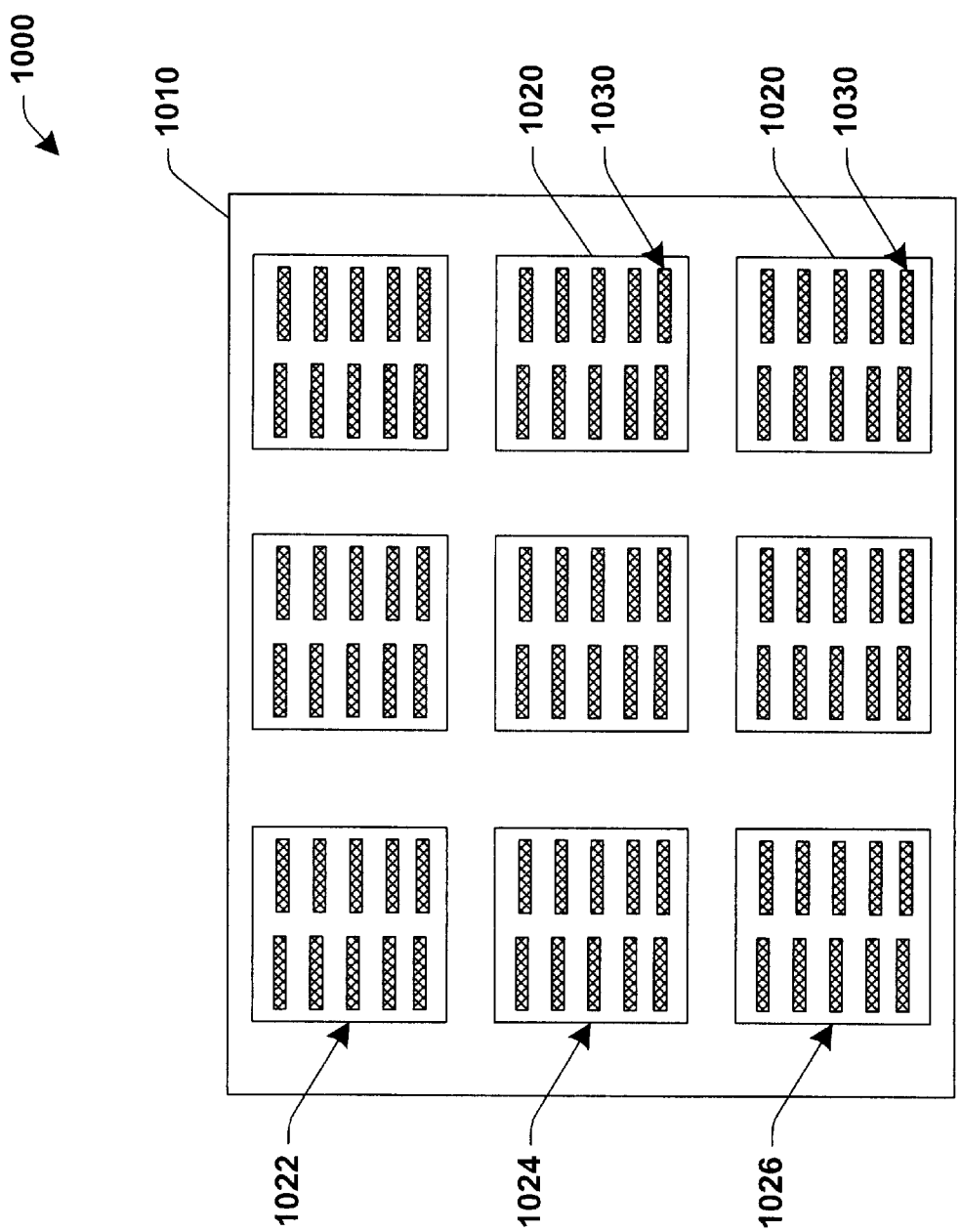
FIG. 10 illustrates a high-level schematic diagram of an output display in accordance with an aspect of the present invention.

Turning now to FIG. 10, an exemplary output display 1000 according to an aspect of the present invention is shown. The display 1000 shows a large sheet 1010 containing one or more wafers 1020 (e.g., 1022, 1024, and 1026). Each wafer 1020 can be divided into portions 1030, whereby each portion 1030 includes one or more quartz crystal sensors. Dividing the wafer 1020 into discreet portions 1030 facilitates separate frequency data collection for each portion and cross-referencing of the data between portions 1030 on the wafer 1020.

In addition to cross-referencing the data within a wafer 1020, the data collected from each wafer 1022, 1024 and 1026 may be cross-referenced with respect to another wafer. For example, assuming it is desired to produce identical wafers 1022 and 1024, the data from wafer 1022 may be cross-referenced with the data from wafer 1024 in order to determine the uniformity between the two wafers. The same may be done with multiple wafers 1020 formed on a single sheet 1010.

Figure 11:
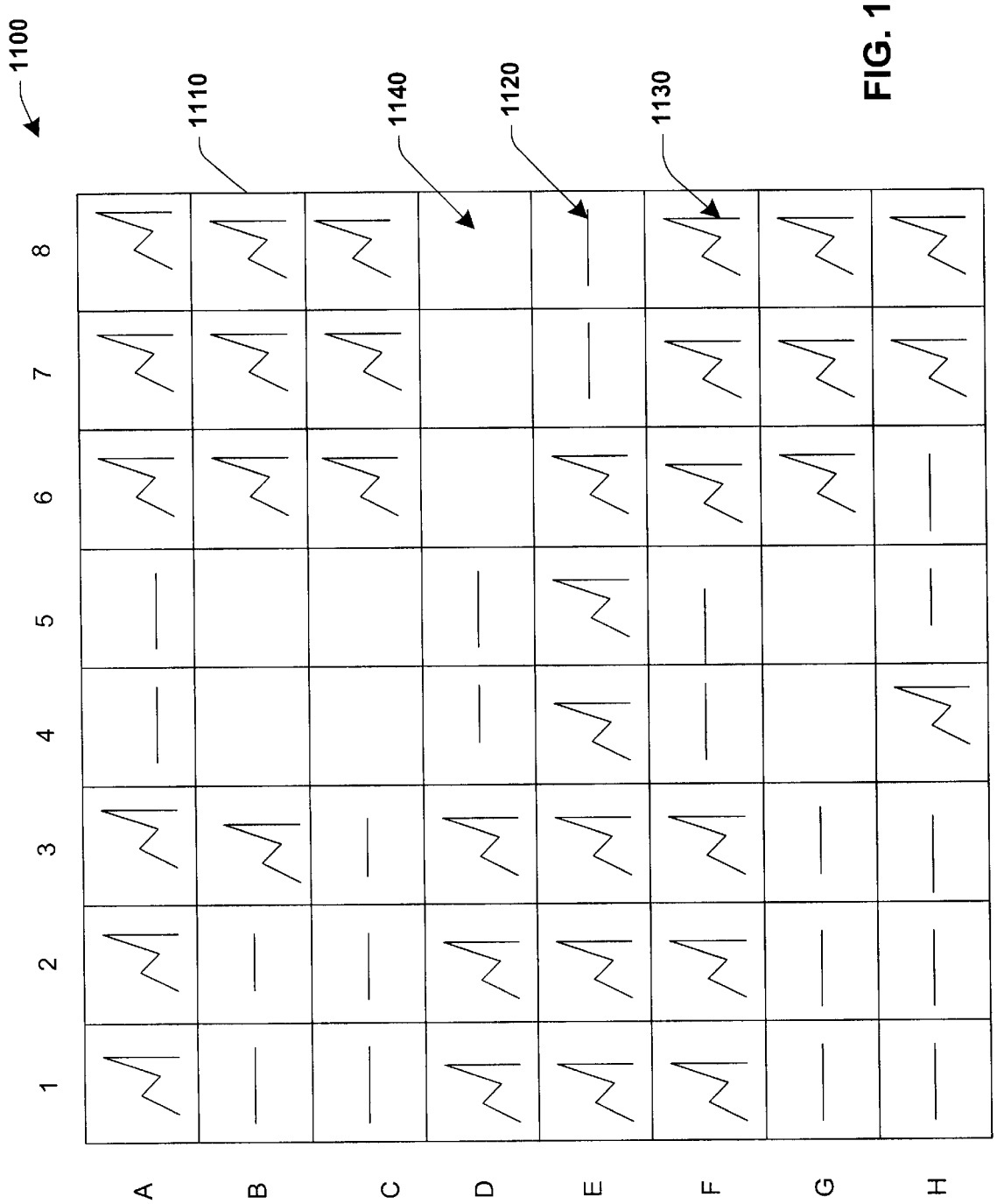
FIG. 11 illustrates a schematic diagram of an output display in accordance with another aspect of the present invention.

FIG. 11 illustrates an exemplary output display of a wafer 1100 which has been divided into grid-like portions 1110 (e.g., A1–A8 . . . H1–H8). Each grid-like portion 1110 may be characterized by a marker such as A1, A2, and the like which represents a discreet location on the wafer 1100. One or more quartz crystal sensors associated with each portion 1110 may also be labeled according to its placement on the wafer 1100 and may be characterized using the same or a similar marker (e.g., A1, A2 and the like). Therefore, each portion 1110 may or may not show frequency data, depending on the location(s) of the sensor(s) and whether a lithography process is occurring above the sensor. For example, portion E8 is exhibiting no substantial frequency activity as indicated by a flat line 1120. Likewise, portion F8 is exhibiting a frequency as indicated by the shaped line 1130. The data 1120, 1130 may be further translated into information more usable to other aspects of a system as described in FIGS. 5–9. If a sensor is not present in a particular portion 1110 of the wafer 1100, then no data will be visible in the respective portion 1110 (e.g., portion D8).

Figure 12:
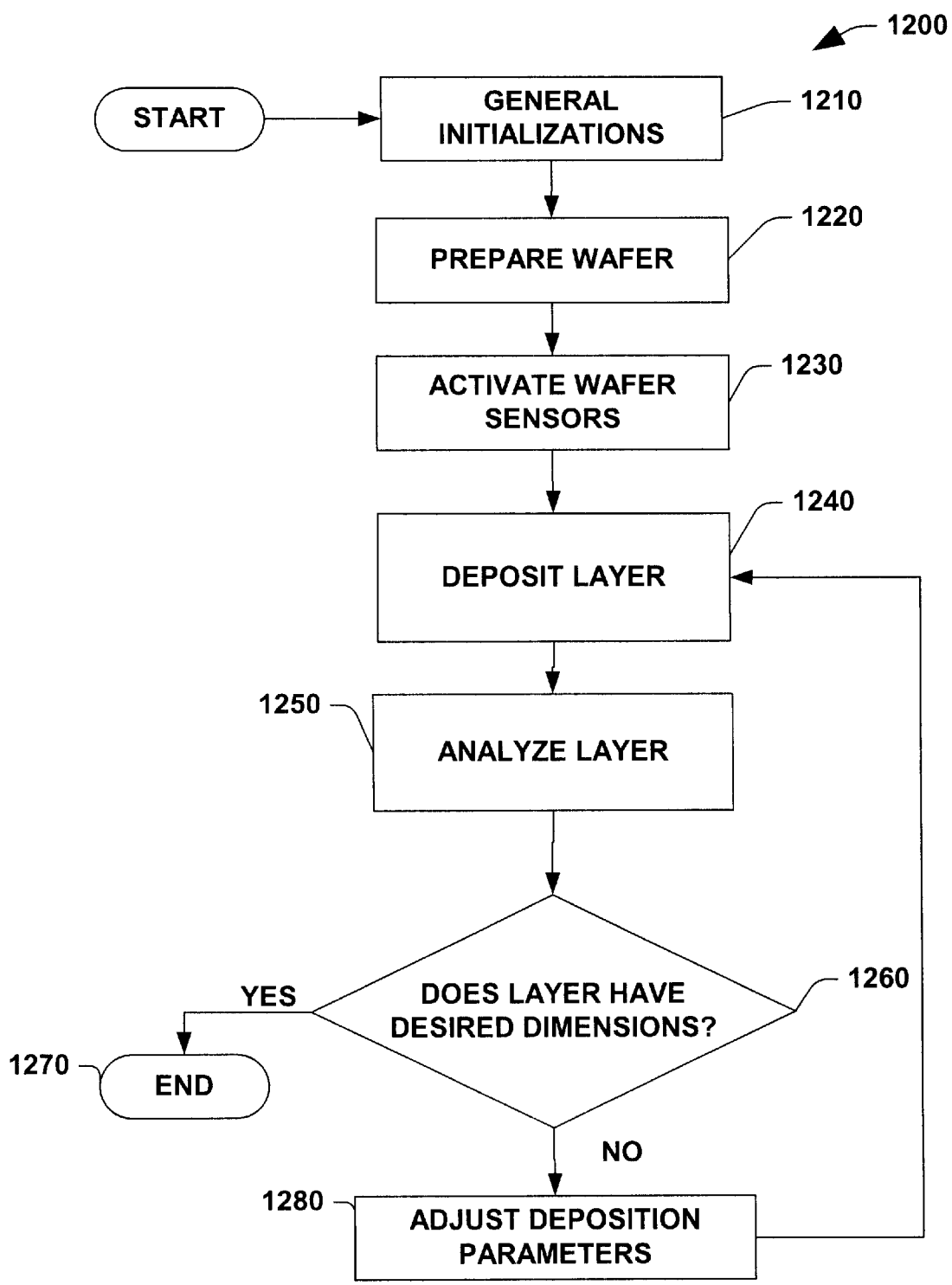
FIG. 12 illustrates a schematic flow diagram of a method in accordance with on aspect of the present invention.

Turning now to FIG. 12, an exemplary feedback-driven, closed loop method 1200 according to one aspect of the present invention is described in a flow diagram. The method 1200 for obtaining consistently formed structures by controlling the progression of a lithography process begins with performing general initializations to the method (at 1210). At 1220, a wafer is prepared to be subjected to a lithography processing such as a deposition or etch process. This preparation may include integrating one or more quartz crystal sensors, a transmitter and/or a voltage source within or on the wafer. At 1230, the one or more sensors are activated by applying a fixed voltage to them. The voltage initiates their vibrating or oscillating movements, which may fluctuate when material is either deposited or removed from above them. It should be appreciated that the sensors may be calibrated before they are employed in the method 1200. Calibration may be performed by exposing the active sensor to the substrate material prior to depositing a layer directly over the substrate, according to known calibration techniques. On the other hand, calibration may be accomplished by exposing the active sensor to a layer prior to etching the layer.

At 1240, a layer may be deposited on the wafer. Once the layer material contacts the wafer, the one or more sensors begin producing frequency data. The frequency data can be communicated to and analyzed at 1250 by a frequency analyzer. At 1260, the analyzer or processing unit or process controller may determine whether the layer being deposited exhibits the desired dimensions. If yes, then the lithography process may terminate at 1270 or continue on without any modulation of the one or more process parameters and one or more process components. However, if the layer is not exhibiting the desired dimensions, the processing unit or process controller may invoke or may make adjustments/corrections to the one or more deposition parameters and to the one or more process components in order to make the layer being deposited uniform and consistent with other wafers made with the same or similar structures.

Once the adjustments or corrections are implemented, the deposition of the layer continues (back to 1240) and the sensors continue to produce frequency data associated with this layer until the frequency data reach a pre-determined value. Once this value is reached, the method 1200 may terminate. In the alternative, the method may terminate according to a pre-set schedule when the frequency data no longer requires corrections to the deposition parameters and components.

By integrating one or more quartz crystal sensors into a wafer undergoing a lithography process and driving the lithography process with real-time information about the structure or layer being formed on the wafer, the progression of the process may be controlled. This reduces the occurrence of mal-formed devices and waste. In addition, it facilitates uniformity within structures formed on a wafer and similar structures formed on a large number of wafers.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a means) used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A feedback-driven, closed-loop system for controlling the progression of a lithography process comprising:

a wafer comprising one or more piezoelectric sensors at one or more locations on the wafer, a voltage source and a transmitter integrated within the wafer, wherein each piezoelectric sensor is operable to generate data relating to the lithography process;

an analyzer operably connected to the wafer for receiving data communicated from the transmitter; and a lithography process controller for regulating one more process parameters and one or more process components based on the data in order to facilitate consistently formed semiconductor devices.

2. The system of claim 1, wherein the lithography process comprises one of a deposition process and an etch process.

3. The system of claim 2, wherein the wafer further comprises at least one layer formed over a substrate when subjected to an etch process.

4. The system of claim 1, wherein the analyzer comprises a microprocessor for computing and transforming data received from the wafer into usable information; and a memory for storing data and information as it relates to a status of the wafer and a status of the progression of the lithography process.

5. The system of claim 1, further comprising a cross-referencing program associated with at least one of the analyzer and the controller that cross-references data generated by the separate piezoelectric sensors to determine whether uniformity exists at a subject layer.

6. The system of claim 5, wherein the processing unit cross-references data generated by the separate piezoelectric sensors to determine whether uniformity exists among more than one layer.

7. The system of claim 1, wherein the analyzer is programmed to measure a frequency of the piezoelectric sensor for a period of time.

8. The system of claim 1, wherein the lithography process is signaled to terminate when the piezoelectric sensor frequency reaches a predetermined value.

9. The system of claim 1, wherein the process controller modulates the one or more process parameters and the one or more process components based on information provided by the analyzer.

10. A feedback-driven, closed loop method for controlling the progression of a lithography process comprising:

providing a wafer comprising one or more quartz crystal sensors at one or more locations on the wafer, a voltage source and a transmitter integrated within the wafer, wherein each quartz crystal sensor is operable to generate data relating to the lithography process;

subjecting the wafer to the lithography process; and during the lithography process, measuring a frequency of the one or more quartz crystal sensor, communicating the measured frequency to an analyzer, relaying information related to the measured frequency back to a lithography process controller, and modulating a lithography process controller in-situ according to the measured frequency in order to facilitate consistently formed semiconductor devices.

11. The method of claim 10, wherein the lithography process comprises one of a deposition process and an etch process.

12. The method of claim 11, wherein the wafer further comprises at least one layer formed over a substrate when subjected to an etch process.

13. The method of claim 10, wherein the analyzer comprises a microprocessor for computing and transforming data received from the wafer into usable information; and a memory for storing data and information as it relates to a status of the wafer and a status of the progression of the lithography process.

14. The method of claim 10, further comprising obtaining separate data from the one or more quartz crystal sensors and cross-referencing the separate data to determine whether structure uniformity exists in the wafer.

15. The method of claim 14, further comprising cross-referencing the separate data to determine whether structure uniformity exists at a layer in the wafer.

16. The method of claim 10, wherein the analyzer is programmed to measure a frequency of the quartz crystal sensor for a period of time.

17. The method of claim 10, wherein the lithography process is signaled to terminate when the measured frequency associated with one or more quartz crystal sensors reaches a predetermined value.

18. The method of claim 10, wherein the lithography process controller modulates one or more process parameters and one or more process components based on information provided by the analyzer.

19. A feedback-driven, closed loop method for controlling the progression of a lithography process comprising:

providing a wafer comprising at least two quartz crystal sensors, a voltage source and a transmitter integrated within the wafer, wherein each quartz crystal sensor is operable to generate data relating to the lithography process;

applying a fixed voltage to the at least two quartz crystal sensors;

subjecting the wafer to the lithography process;

during the lithography process, obtaining separate data from each of the at least two quartz crystal sensors, communicating the separate data to an analyzer, feeding information corresponding to the separate data back to a lithography process controller, and modulating one or more process parameters and one or more process components in-situ according to the data in order to obtain consistently formed semiconductor devices; and cross-referencing the separate data in order to determine whether uniformity exists in at least two locations on the wafer.

20. The method of claim 19, wherein the wafer comprises at least four quartz crystal sensors arranged in clusters, each cluster comprising at least two quartz crystal sensors and located at two or more areas on the wafer, wherein each quartz crystal sensor is operable to generate data relating to the lithography process.

21. The method of claim 20, further comprising obtaining separate data for at least two clusters of sensors and cross-referencing the data obtained from the at least two clusters in order to determine whether uniformity exists in at least two areas on the wafer.

22. The method of claim 19, wherein obtaining the separate data from each of the at least two quartz crystal sensors occurs simultaneously with the on-going lithography process such that the data is obtained and the modulations are made in real-time.

23. The method of claim 19, wherein the lithography process comprises one of a deposition process and an etch process.

24. The method of claim 23, wherein the wafer further comprises at least one layer formed over a substrate when subjected to an etch process.

25. The method of claim 19, wherein the one or more quartz crystal sensors are arranged in at least one of a random and an orderly pattern.

26. The method of claim 19, wherein the lithography process is signaled to terminate when the frequency associated with the one or more quartz crystal sensors reaches a predetermined value.

27. The method of claim 19, further comprising providing a plurality of wafers, wherein each wafer generates separate frequency data.

28. The method of claim 19, further comprising cross-referencing the plurality of wafers using the frequency data obtained from each wafer in order to determine structure uniformity among the plurality of wafers.

29. A feedback-driven, closed loop system for obtaining consistently formed semiconductor devices comprising:

a plurality of wafers, each wafer comprising one or more quartz crystal sensors, a voltage source and a transmitter integrated within the wafer, wherein each quartz crystal sensor is operable to generate data relating to the lithography process;

an analyzer operably connected to each wafer for receiving data communicated from the transmitter;

a processor for cross-referencing the data obtained from the plurality of wafers to determine structure uniformity among the plurality of wafers; and a lithography process controller for regulating one more process parameters and one or more process components based on the data in order to achieve consistently formed semiconductor devices.

30. The system of claim 29, wherein the one or more sensors are individual sensors at one or more locations on the wafer and each individual sensor generates separate data whereby the separate data may be cross-referenced in order to determine structure uniformity on each wafer.

31. The system of claim 29, wherein the one or more sensors are arranged in at least two clusters of sensors at one or more locations on the wafer and each cluster generates separate data whereby the separate data may be cross-referenced in order to determine structure uniformity on each wafer.

* * * * *

UNITED STATES PATENT AND TRADEMARK OFFICE
CERTIFICATE OF CORRECTION

PATENT NO.     : 6,654,659 B1                                              Page 1 of 1
DATED          : December 2, 2003
INVENTOR(S)    : Christopher F. Lyons et al.

It is certified that error appears in the above-identified patent and that said Letters Patent is hereby corrected as shown below:

<u>Title page,</u>
Item [73], Assignee, please change from "Advanced Micro Drvices, Inc." to
-- Advanced Micro Devices, Inc. --

Signed and Sealed this

Seventeenth Day of February, 2004

JON W. DUDAS
*Acting Director of the United States Patent and Trademark Office*